(12) United States Patent
Streett

(10) Patent No.: US 6,438,188 B1
(45) Date of Patent: Aug. 20, 2002

(54) METHOD AND APPARATUS FOR A DIGITALLY CONTROLLED CONSTANT CURRENT SOURCE FOR PHASE ADJUSTMENT OF A SYNTHESIZED CLOCK

(75) Inventor: David J. Streett, Lewisville, TX (US)

(73) Assignee: Alcatel USA Sourcing, L.P., Plano, TX (US)

( * ) Notice: Subject to any disclaimer, the term of this patent is extended or adjusted under 35 U.S.C. 154(b) by 0 days.

(21) Appl. No.: 09/228,451

(22) Filed: Jan. 11, 1999

(51) Int. Cl.[7] .................................................. H03D 3/24
(52) U.S. Cl. ........................ 375/376; 375/375; 359/162; 341/100; 341/101
(58) Field of Search ................................ 375/376, 375; 327/147, 150, 156, 159; 359/162; 341/100, 101

(56) References Cited

U.S. PATENT DOCUMENTS

| | | | | |
|---|---|---|---|---|
| 4,829,258 A | * | 5/1989 | Volk et al. ................... 327/156 |
| 5,357,249 A | * | 10/1994 | Azaren et al. ............... 341/100 |
| 6,014,177 A | * | 1/2000 | Nozawa ....................... 348/540 |
| 6,150,887 A | * | 11/2000 | Yamaguchi ................... 331/11 |
| 6,154,097 A | * | 11/2000 | Yoshioka ..................... 331/18 |
| 6,249,685 B1 | * | 6/2001 | Sharaf et al. ................ 455/550 |

* cited by examiner

Primary Examiner—Chi Pham
Assistant Examiner—Phuong Phu
(74) Attorney, Agent, or Firm—Baker Botts, LLP; V. Lawrence Sewell; Jessica W. Smith

(57) ABSTRACT

An apparatus for adjusting the phase difference of a first clock signal (48) and a second clock (50) is disclosed. The apparatus includes a phase indicator (42) which receives a first clock signal (48) and a second clock signal (50) and determines a phase relationship. A microprocessor (44) outputs a digital value related to the phase relationship. An analog to digital converter (46) receives the digital value and outputs an analog value based on the digital signal. After that a voltage controlled constant current source (47) receives the analog value and outputs a constant current source proportional to the analog value. Finally, a phase lock loop circuit (10) receives the constant current source and adjusts the phase relationship.

14 Claims, 3 Drawing Sheets

METHOD AND APPARATUS FOR A DIGITALLY CONTROLLED CONSTANT CURRENT SOURCE FOR PHASE ADJUSTMENT OF A SYNTHESIZED CLOCK

TECHNICAL FIELD OF THE INVENTION

This invention relates in general to the field of timing circuitry. More particularly, this invention relates to a method and apparatus for a digitally controlled constant current source for phase adjustment of a synthesized clock.

BACKGROUND OF THE INVENTION

In synchronous circuit applications, the clock signal is of the utmost importance. In particular, telecommunication switching systems require dependable timing signals to operate properly and to transmit digital data signals error free. To avoid failures caused by errors such as loss of clock and loss of frame, and to facilitate system fault diagnosis and testing, redundant timing signals may be provided. By using redundant timing signals, the system may operate with a backup timing signal upon detection of erroneous conditions in the active timing signal. Craft persons may also manually swap the timing signals in order to perform system diagnostics, maintenance and/or repairs. In telecommunication systems where high-speed data are transmitted, even single bit errors cannot be tolerated. It may be seen that in order to switch from one active clock signal to the other, the clock signals must be fully synchronous in frequency and phase to avoid producing bit errors in the data transmission.

One approach to solve this problem is to implement digital delay lines to phase align the redundant reference signals. A disadvantage of this approach is that it requires a large amount of delay lines to phase-align the redundant signals. Large numbers of delay lines lead to problems of temperature sensitivity of the digital lines. This problem is particularly acute in low frequency operation, where the number of delay lines becomes extremely large. An additional problem associated with this approach is that it is difficult to control phase wander in digital circuits. While it is possible to remedy this problem by to having each reference clock monitor the other, this solution is problematic because the circuitry necessary to control the cross-monitoring is very complex and expensive. Additionally, this solution presents problems of false detection of faults between the clocks.

Another solution to the problem of monitoring wander in the reference clocks is to monitor the two redundant reference clocks with a third clock. This solution, however, creates an additional expense of a third clock. Moreover, this solution places reliance on an unmonitored third clock, which has no guarantee of itself being accurate.

Still another approach is to use analog delay lines to align the phase of the redundant clocks. This solution is not realistic because the necessary analog lines are prohibitively expensive and take up too much space.

Yet another solution is to use a phase-locked loop to align a clock with another clock or a reference clock. However, this approach does not lend itself to fine adjustments.

Accordingly, a need has arisen for a circuit to closely phase align clock signals and permit fine adjustments to be made.

SUMMARY OF THE INVENTION

From the foregoing, it may be appreciated that a need has arisen for a method and apparatus for a digitally controlled constant current source for phase adjustment of a synthesized clock. In accordance with the present invention a method and apparatus for a digitally controlled constant current source for phase adjustment of a synthesized clock is provided which substantially eliminates or reduces the disadvantages and problems associated with prior adjustment methods.

In one embodiment an apparatus for adjusting the phase difference of a first clock signal and a second clock is provided. The apparatus includes a phase indicator which receives a first clock signal and a second clock signal and determines a phase relationship. A microprocessor outputs a digital value related to the phase relationship. An analog to digital converter receives the digital value and output an analog value based on the digital value. After that a voltage controlled constant current source receives the analog value and outputs a constant current source proportional to the analog value. Finally, a phase lock loop circuit receives the constant current source and adjusts the phase relationship.

The present invention provides various technical advantages over the conventional adjustment methods. For example, fine phase adjustments can be made. Other technical advantages are readily apparent to one skilled in the art from the following figures, descriptions and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1:
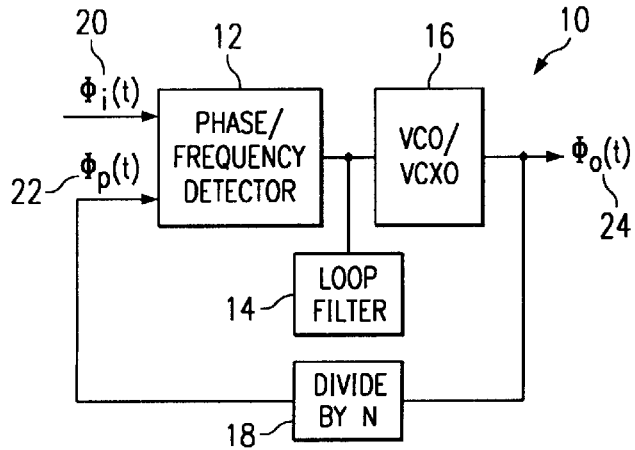
FIG. 1 is a block diagram of a phase lock loop circuit.

FIG. 1 is a block diagram of a standard phase-locked loop circuit 10. Illustrated are a change phase/frequency detector 12 coupled to a loop filter 14 which is coupled to a voltage control oscillator (VCO) 16 (alternatively, a voltage control crystal oscillator (VCXO) can be utilized) which is coupled to a divide by N circuit 18.

In operation, an input clock signal $\phi_i(t)$ 20 and a feedback clock signal $\phi_f(t)$ 22 are inputted into phase/frequency detector 12. Phase/frequency detector 12 is operable to determine the phase difference (whether one clock lags or leads the other and by how much) between the input clock signal 20 and the feedback clock signal 22 and output a current value based on the phase difference. In the case where input clock signal 20 leads feedback clock signal 22, phase/frequency detector 12 sources a current which charges a capacitor in loop filter 14. This increases the voltage applied to VCO 16 which causes an output clock signal $\phi_o(t)$ 24 to move forward in phase and correspondingly causes feedback clock signal 22 to move forward in phase towards alignment with input clock signal 20.

If feedback clock signal 22 leads input clock signal 20, then phase frequency detector 16 sinks current which will pull charge off the capacitor in loop filter 14. This decreases the voltage to VCO 16 which causes output clock signal 24 to move back in phase which causes feedback to move towards alignment with input clock signal 20.

Divide by N circuitry reduces the frequency of the output of VCO 16 when VCO 16 is used to multiply the input frequency. For example, an input clock of 6 MHZ can be outputted at 48 MHz after passing through VCO 16. Divide by N circuitry is used to bring the frequency back to 6 MHZ so the clock signal can be used as a feedback clock.

Figure 2:
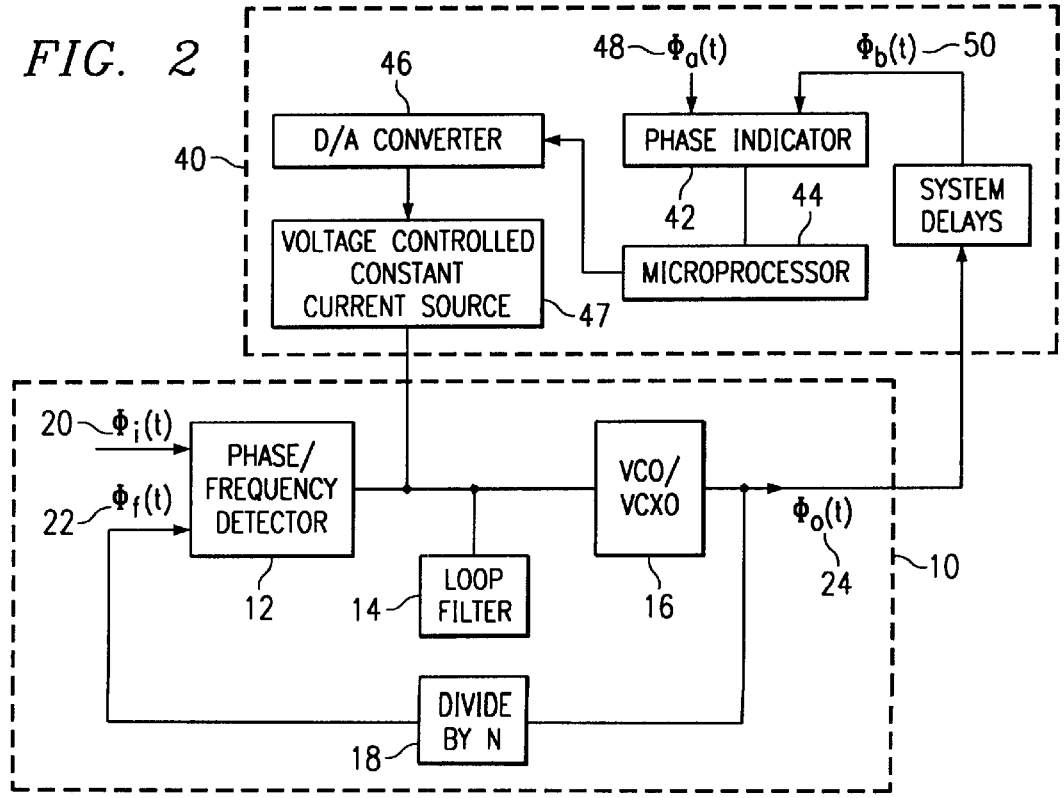
FIG. 2 is a block diagram of a digitally controlled current source for phase adjustment in accordance with the teachings of the present invention.

FIG. 2 is a block diagram of a digitally controlled current source for phase adjustment 40 in accordance with the teachings of the present invention. Illustrated is the phase-locked loop 10 as described in FIG. 1 with the digitally controlled current source 40 added. Digitally controlled current source 40 comprises a phase indicator 42 coupled to a microprocessor 44 which outputs to a D/A converter 46. D/A converter 46 outputs an analog signal to a voltage controlled constant current source 48.

In operation, a first clock signal, $\phi_a(t)$ 48, is inputted into phase indicator 42 along with a second clock signal, $\phi_b(t)$ 50. Second clock signal 50 is the output clock signal, $\phi_o(t)$ 24, after passing through long lines or other system delays 56. In one embodiment first clock signal is received clock signal. Phase indicator 42 is operable to determine the phase relationship between first clock signal 48 and second clock signal 50 (i.e., if first clock signal 48 lags or leads second clock signal 50). Microprocessor 44 is operable to read the phase relationship from phase indicator 42 and is operable to output a digital value based on the phase relationship. This digital value can be a fixed value can be based on an optimizing algorithm. The algorithm is described in FIG. 4.

The digital value is received by digital to analog converter 46 which converts the digital signal from microprocessor 44 to an analog value. In one embodiment, digital to analog connectors is an eight bit register. The value of the digital determines the analog value outputted. The analog value is received by voltage control constant current source 48 which converts the analog value into a proportional constant current source which is outputted to phase lock loop 10.

This changes the input voltage to VCO/VCXO which changes the phase relationship between input clock signal 20 and feedback clock signal 22 which ultimately adjusts the phase relationship between the first clock signal 48 and the second clock signal 50.

Figure 3:
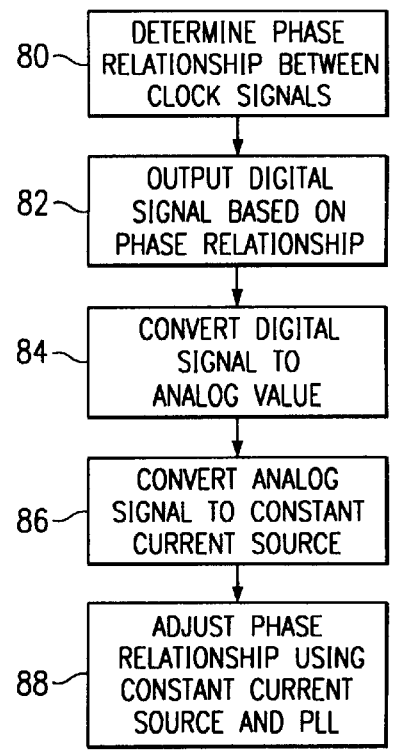
FIG. 3 is a flowchart detailing an embodiment of the present invention.

FIG. 3 is a flowchart outlining an embodiment of the present invention. In step 80, a first clock signal 48 and a second clock signal 50 are received at a phase indicator 42 which determines a phase relationship. A digital signal based on the phase relationship is outputted by microprocessor 44 in step 82. In step 84, the digital signal is converted to an analog value using an analog to digital converter 46. In step 86, the analog value is converted into a proportional constant current source using a voltage controlled constant current source. The phase relationship is adjusted using the constant current source and a phase locked loop circuit 10 in step 88.

Figure 4:
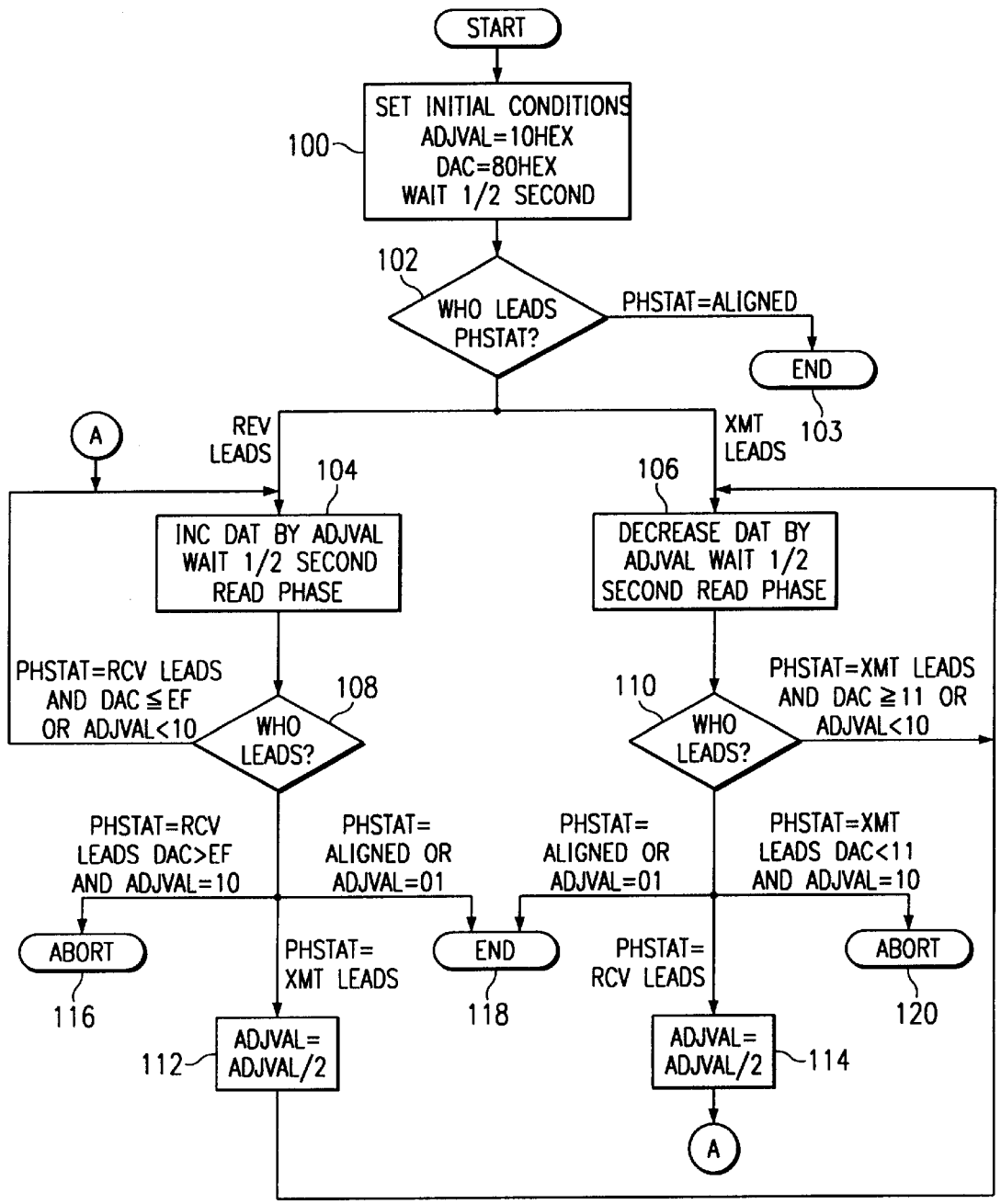
FIG. 4 is a flowchart outlining the phase adjustment algorithm.

FIG. 4 is a flow chart outlining one embodiment of the phase alignment algorithm. In step 100 initial conditions are set. In one embodiment, digital to analog converter 46 has a register value of (which in one embodiment is an eight-bit register) 80 hex. Eight hex is equivalent to 128 decimal and 100000000 binary. Thus 80 hex would correspond to 100000000 in the eight-bit register. The adjustment value (ADJVAL) is set to 10 hex. The adjustment value is used to adjust digital to analog converter 46. In step 102 microprocessor checks phase indicator 42 to determine if the transmitting clock leads the receiving clock, if the receiving clock leads the transmitting clock, or if the clocks are aligned within 100 picoseconds. This is the PHSTAT value.

If the clocks are aligned, the algorithm ends. If the receiving clock leads, then in step 104 the clock is adjusted by a set amount corresponding to the value stored in the register of digital to analog converter 46. For example, if the register's value is 80 hex, in one embodiment the phase adjustment would be 25.146 nsec. The time adjust is actually made by outputting a current from voltage controlled constant current source 48. The amount of current outputted is proportional to the eventual time adjustment. After the clock is adjusted, the register of digital to analog converter 46 is adjusted by increasing the register by the ADJVAL and, after a half second wait to allow for transients to settle, the phase is read again in decisional block 108.

Returning to decisional block 102, if the transmitting clock leads, in step 106, the clocks are adjusted as discussed previously. Then the digital to analog converter 46 register is adjusted by decreasing the register by the ADJVAL. After waiting half a second, the phase of the clocks are read in decisional block 110.

Returning to decisional block 108, it is determined which clock is leading. If clocks are aligned within 100 psec or if the ADJVAL is less than one then the system is considered aligned and the algorithm ends in step 118. If the receiving clock still leads and the DAC value is less than or equal to EF hex and ADJVAL is less than 10 then control returns to step 104. If the receiving clock is still leading and DAC is greater than EF and ADJVAL is greater then 10 then the system is in error and the process is aborted in step 116.

If the transmitting clock leads the receiving clock then the ADJVAL is recalculated by dividing the old ADJVAL by two and the process continues at step 106.

Returning to decisional step 110, if the clocks are aligned within 100 psec or ADJVAL is equal to 1 the clocks are considered aligned and the process ends. If the transmitting clock leads and the DAC is greater than 11 hex or ADJVAL is less than 10 hex, the process continues at step 106. If transmitting leads receiving clock and the DAC is less than 11 hex and ADJVAL=10 hex the system is in error and the process is aborted in step 120.

If the receiving clock is now leading the transmitting clock, a new ADJVAL is formed by dividing the old ADJVAL by two. Then the algorithm continues at step 104.

Figure 5:
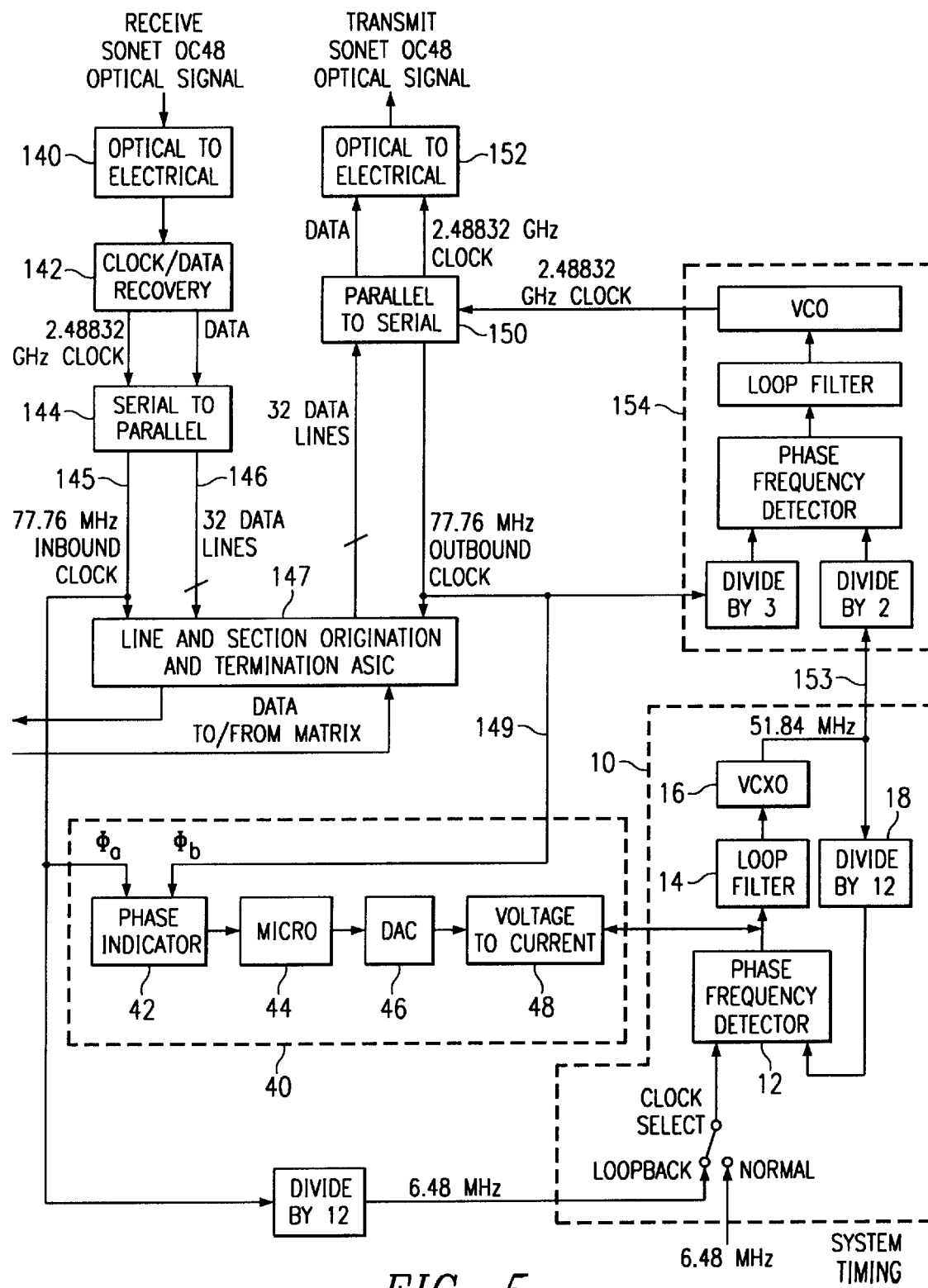
FIG. 5 is a block diagram for a timing and data unit in a telecommunication system.

FIG. 5 is a block diagram of a timing and data unit for telecommunications. An optical to electrical converter 140 is coupled to a clock data recovery unit 142 which in turn couples to a serial to parallel converter 144. Part of the output of serial to parallel converter 146 passes to an ASIC 148 which passes data to and from a switch matrix (not shown). Part of the output of serial to parallel converter 144, a receiving clock signal 145 passes to the phase indicator 42 of the digitally controlled constant current source 40, as described in FIG. 2. Phase indicator 42 also receives a transmitting clock signal 149 from transmit parallel to serial converter 150. Transmit parallel to serial converter receives data from ASIC 147 which passes data and a clock signal to optical to electrical converter 152. Included along with digitally controlled constant current source 40 and phase lock loop 10 is second phase lock loop 154 designed to produce a phase aligned transmitting clock at a high frequency.

In operation, incoming optical communication signals are received by optical to electrical converter 140 where the optical signal is converted to an electrical communication signal. At clock data recovery 142 a 2.48832 GHz clock signal and data signals are recovered from the electrical signal. The data signals, now in a serial format, are converted to a parallel format in serial to parallel converter 144. The 2.48832 GHz clock is reduced to a 77.76 MHz clock signal, the receiving clock signal 145. Serial to parallel converter 144 outputs both receiving clock signal 145 and parallel data signals 146 to an ASIC 147. ASIC 147 is operable to receive and transmit data to and from the switching matrix (not pictured). Data received from the matrix is sent to the transmit path. Data is transmitted and received synchronously thus the requirement for synchronization.

Data received from the matrix is sent in parallel format 40 to parallel to serial converter 150 where the parallel data is converted to serial format and sent to optical to electrical converter 152 where the electrical data is converted to an optical format for transmission. Parallel to serial converter 150 receives a clock signal at 2.48832 GHz from a second phase lock loop 154. The clock signal is both sent to electrical to optical converter 152 as a 2.48843 GHz clock signal. Parallel to serial converter 150 also outputs the clock signal as a 77.76 MHz clock signal the outbound clock signal 149, to ASIC and phase indicator 42.

Phase indicator 42, microprocessor 44, digital-to-analog converter 46 and constant current source 48 inputs into phase lock loop 10. Phase lock loop 10 operates as described in FIG. 2 to output a clock signal matched in phase to inbound clock signal 145. Second phase lock loop 154 takes output clock 153 to produce an outbound clock signal (2.4832 GHz clock in one embodiment) with a phase matched with input clock.

Thus it is apparent that there has been provided, in accordance with the present invention, a method and apparatus for a digitally controlled constant current source that satisfies the advantages set forth above. Although a main embodiment has been described in detail, it should be understood that various changes, substitutions, and alterations readily ascertainable by one skilled in the art can be made herein without departing from the spirit and scope of the present invention as defined by the following claims.

What is claimed is:

1. An apparatus for matching the phase of an input clock and output clock comprising:
   a digitally controlled constant current source,
   a phase lock loop circuit coupled to the digitally controlled constant current source, wherein the digitally controlled constant source outputs an adjustment current proportional to a phase difference of an input clock signal and an output clock signal and the phase look loop circuit is operable to use the adjustment current to match the phase of the input clock signal and the output clock signal;
   wherein the digitally controlled constant current source comprises:
      a phase indicator operable to receive a reference clock signal and a delayed clock signal based on the output clock signal and determine a phase difference;
      a microprocessor operable to output a digital value related to the phase difference;
      a digital-to-analog converter coupled to the microprocessor and operable to convert the digital value to an analog value; and
      a voltage controlled constant current source operable to receive the analog value and output the adjustment current proportional to the analog value.

2. The apparatus of claim 1, wherein the microprocessor uses a search algorithm to determine the digital value.

3. The apparatus of claim 1, wherein the input clock signal is a received clock signal and the output clock signal is a transmission clock signal in a communications system.

4. The apparatus of claim 2, wherein the digital-to-analog converter includes a register to store the digital value.

5. The apparatus of claim 4, wherein the search algorithm updates the register of the digital-to-analog converter based on the phase difference between the input clock signal and the output clock signal.

6. A method for adjusting the phase difference of a first clock signal and a second clock signal comprising:
   receiving a first clock signal and a second clock signal at a phase indicator;
   determining a phase difference;
   outputting a digital signal from a microprocessor based on the phase difference;
   converting the digital signal to an analog value using an analog to digital converter;
   converting the analog value into a proportional constant current source using a voltage controlled constant current source; and
   adjusting the phase difference using the constant current source and a phase locked loop circuit.

7. The method of claim 6, wherein the phase lock loop circuit comprises:
   a phase/frequency detector operable to receive an input clock signal and a feedback clock signal and produce an output proportional to the phase difference between the input clock signal and the feedback clock signal;
   a voltage controlled oscillator coupled to the phase frequency detector; and
   a loop filter coupled between the phase/frequency detector and the voltage controlled oscillator, the loop filter operable to change the voltage received by the voltage controlled oscillator based on the output of the phase/frequency detector.

8. The method of claim 6, wherein the microprocessor uses a search algorithm to determine a digital value to output.

9. The method of claim 6, wherein the voltage controlled current source can be adjusted to change the magnitude of the constant current source.

10. The method of claim 6, wherein the analog to digital converter includes a register to store the digital value.

11. The method of claim 10, wherein the search algorithm updates the register of the analog to digital converter based on the phase difference between the input clock and the output clock.

12. A system for synchronizing an inbound clock and an outbound clock comprising:
   an optical to electrical converter operable to receive an optical communication signal;
   a clock/data recovery unit coupled to the optical to electrical converter and operable to receive and separate an inbound clock signal and data from the optical signal;
   a line and section origination and termination ASIC operable to receive incoming data and transfer the data to and from a switching matrix and to output data to a transmit unit;

a digitally controlled constant current source operable to receive the inbound clock signal and the outbound clock signal and output a current proportional to the phase difference between the signals; and, a phase-lock loop coupled to the digitally controlled constant current source and operable to receive the current and adjust the phase of the outbound clock signal to match the inbound signal.

13. The system of claim 12, wherein the system further comprises a parallel to serial converter operable to receive data from the ASIC and convert the data to a serial format.

14. The system of claim 13, wherein an optical to electrical converter is operable to receive data from the parallel to serial converter and convert the data to an optical signal for transmission.

* * * * *